United States Patent
Dasgupta et al.

(10) Patent No.: US 6,583,667 B1
(45) Date of Patent: Jun. 24, 2003

(54) HIGH FREQUENCY CMOS DIFFERENTIAL AMPLIFIERS WITH FULLY COMPENSATED LINEAR-IN-DB VARIABLE GAIN CHARACTERISTIC

(75) Inventors: Uday Dasgupta, Singapore (SG); Wooi Gan Yeoh, Singapore (SG)

(73) Assignees: Institute of Microelectronics, Singapore (SG); Oki Techno Centre (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/027,981

(22) Filed: Dec. 20, 2001

(51) Int. Cl.[7] .................................................. H03F 3/45
(52) U.S. Cl. ...................................... 330/254; 330/256
(58) Field of Search .......................... 327/359; 330/254, 330/256, 260, 261

(56) References Cited

U.S. PATENT DOCUMENTS

| | | | |
|---|---|---|---|
| 4,459,555 A | 7/1984 | Jett, Jr. ........................ 330/253 |
| 4,816,772 A | 3/1989 | Klotz ........................... 330/254 |
| 5,030,924 A * | 7/1991 | Fritz ............................ 330/256 |
| 5,159,288 A * | 10/1992 | Ito ........................... 330/256 X |
| 5,880,631 A | 3/1999 | Sahota ........................... 330/51 |
| 6,011,437 A | 1/2000 | Sutardja et al. ............... 330/254 |
| 6,020,786 A * | 2/2000 | Ashby ........................... 330/256 |
| 6,124,761 A * | 9/2000 | Robinson et al. ............. 330/254 |
| 6,127,890 A | 10/2000 | Shimomura et al. ........ 330/254 |
| 6,259,321 B1 | 7/2001 | Song et al. ................... 330/254 |
| 6,271,726 B1 | 8/2001 | Fransis et al. ............... 330/254 |
| 6,297,698 B1 | 10/2001 | Callahan, Jr. ............... 330/254 |
| 6,369,618 B1 * | 4/2002 | Bloodworth et al. ... 330/256 X |

* cited by examiner

*Primary Examiner*—Steven J. Mottola
(74) *Attorney, Agent, or Firm*—George O. Saile; Stephen B. Ackerman

(57) ABSTRACT

A high frequency CMOS differential amplifier which comprises: a variable gain amplifier which amplifies differential input; a temperature sensing circuit; a gain-slope correction circuit which produces an intermediate control voltage as a function of temperature, thereby compensating for a change in slope of the gain control characteristics with temperature of the variable gain amplifier; a gain compensation circuit which is used to correct temperature/process variations of MOS transistors in high frequency differential amplifiers; and a bias control circuit.

37 Claims, 10 Drawing Sheets

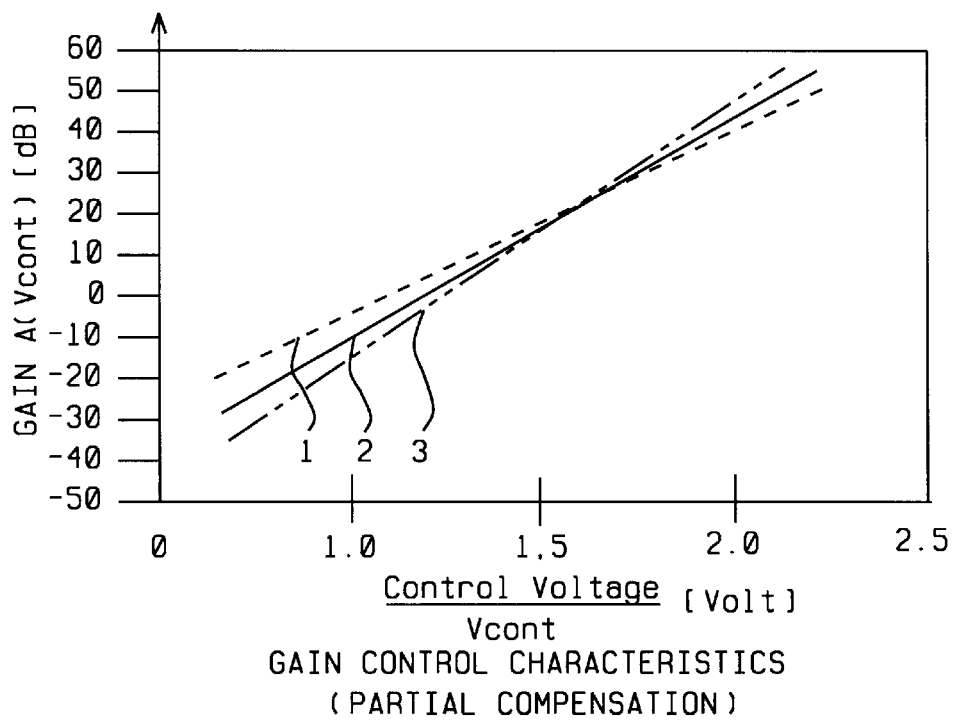
FIG. 7 GAIN CONTROL CHARACTERISTICS (PARTIAL COMPENSATION)
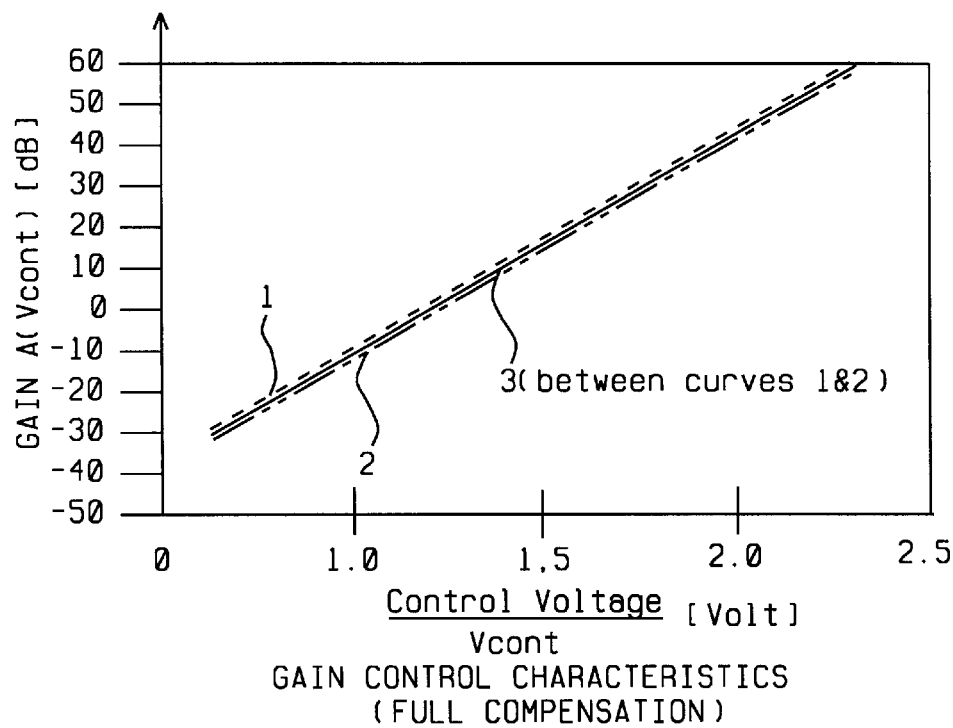
FIG. 8 GAIN CONTROL CHARACTERISTICS (FULL COMPENSATION)

HIGH FREQUENCY CMOS DIFFERENTIAL AMPLIFIERS WITH FULLY COMPENSATED LINEAR-IN-DB VARIABLE GAIN CHARACTERISTIC

RELATED PATENT APPLICATION

IME2000-020, A GAIN COMPENSATION CIRCUIT FOR CMOS AMPLIFIERS, title filing date: Aug. 22, 2001, Ser. No. 09/933,964, assigned to a common assignee.

IME2000-021, GENERAL-PURPOSE TEMPERATURE COMPENSATING CURRENT MASTER-BIAS CIRCUIT, title filing date: Oct. 24, 2001, Ser. No. 09/999,001, assigned to a common assignee.

IME2001-003, HIGH FREQUENCY CMOS FIXED AND VARIABLE GAIN AMPLIFIERS, title filing date: Nov. 9, 2001, Ser. No. 10/036,597, assigned to a common assignee.

BACKGROUND OF THE INVENTION

1. Field of the Invention

The invention relates to high frequency, variable gain, differential amplifiers, and more particularly to the design of a high frequency, variable gain CMOS amplifier with a linear-in-dB gain control characteristic, compensated for temperature and fabrication process variations.

2. Description of the Related Art

Circuits for high frequency, variable gain, differential amplifiers were previously designed in bipolar technology. The well-defined and well-known input voltage to output current characteristic of the bipolar device makes the circuit design relatively easy. However, MOS characteristics are not so well-defined and are relatively difficult to use in circuit designs. However, CMOS designs are much preferred because of the advantages in fabrication. There are some CMOS differential amplifier designs in the literature which address one or the other aspect of compensating for variations in bias, gain, or temperature, but none address all those aspects together.

Related U.S. Patents referring to differential amplifier with compensation are:

- U.S. Pat. No. 6,259,321B1 (Song et al.) discloses a CMOS variable gain multi-stage amplifier with linear-in-dB and variable gain control.
- U.S. Pat. No. 6,127,890 (Shimomura et al.) teaches the use of a first differential amplifier with a gain proportional to a control voltage in a low region of the control voltage, and a second differential amplifier with a gain proportional to a control voltage in a high region of the control voltage. Both amplifiers are bipolar, however.
- U.S. Pat. No. 6,011,437 (Sutardja et al.) shows a multi-stage high bandwidth, variable gain amplifier where the gain of each stage is controlled individually.
- U.S. Pat. No. 5,880,631 (Sahota) describes a multi-stage low power, high dynamic range, variable gain amplifier, where the amplifier proper uses bipolar transistors.
- U.S. Pat. No. 4,816,772 (Klotz) discloses a single input, bipolar AGC amplifier with multiple stages and applies a linearization control voltage to each stage.
- U.S. Pat. No. 4,459,555 (Jett, Jr.) presents a CMOS variable gain differential amplifier in which the signal level is gain controlled in response to a control voltage without varying the d-c conditions.
- U.S. Pat. No. 6,297,698B1 (Callahan, Jr.) teaches a variable differential gain amplifier where the gain is regulated by a three input comparator.
- U.S. Pat. No. 6,271,726 (Fransis et al.) shows bipolar variable gain single input amplifier which has temperature, digital slope, and offset control.

The problem is to design a variable gain amplifier for high frequency applications in CMOS technology where gain is to be varied with a control voltage and where the variation in the gain must follow a linear-in-dB characteristic. The gain characteristic also needs to be compensated for temperature and fabrication process variations. It should be noted that none of the above cited U.S. Patents have been able to address all of the above cited requirements. The present invention discloses circuits which meet those requirements.

SUMMARY OF THE INVENTION

It is an object of at least one embodiment of the present invention to provide a variable gain amplifier for high frequency applications in CMOS technology where gain is to be varied with a control voltage and where the variation in the gain must follow a linear-in-dB characteristic.

It is another object of the present invention to provide for a gain characteristic which is compensated for temperature and fabrication process variations.

It is yet another object of the present invention to provide an amplifier with automatic gain control (AGC).

It is still another object of the present invention to provide an amplifier where the gain can be trimmed and adjusted for any desired accuracy.

It is a further object of the present invention is to provide a linear-in-dB characteristic which is compensated for both temperature and process variations.

It is yet a further object of the present invention is to provide a high frequency amplifier which overcomes problems due to transistor mismatches.

These and many other objects have been achieved by a high frequency CMOS differential amplifier which comprises:

a high frequency variable gain amplifier, either direct or capacitor coupled, which may contain more than two stages, and which amplifies a first and a second input signal In1 and In2, where the gain of the amplifier depends on a first and a second bias current $I_{B1}$ and $I_{B2}$.

A temperature sensing circuit which provides a band-gap plus proportional-to-absolute-temperature (PTAT) dependent current $I_{PTAT}$, and a temperature independent first and second reference current $I_{REF1}$ and $I_{REF2}$.

A gain-slope correction circuit which receives a first and a second control voltage $V_{CONT}$ (the DC control voltage) and $V_{COM}$ (the analog common), respectively, $I_{REF1}$, and $I_{PTAT}$ and which produces an intermediate control voltage $V_{CT}$ as a function of temperature by digitally comparing $I_{REF1}$ and $I_{PTAT}$, thereby compensating for a change in slope of the gain control characteristics with temperature of the high frequency variable gain amplifier.

A gain compensation circuit which receives $I_{REF2}$ and generates a biasing current $I_B$ which is modulated to compensate for the gain of the high frequency variable gain amplifier using a differential and an operational amplifier.

A bias control circuit which receives $V_{CT}$ and $V_{COM}$ and divides $I_B$ into $I_{B1}$ and $I_{B2}$ by comparing $V_{CT}$ against reference voltages $V_R$, which are generated from $V_{COM}$.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 7 is a graph of the high frequency CMOS differential amplifier gain control characteristics with partial compensation at three temperatures.

FIG. 8 is a graph of the high frequency CMOS differential amplifier gain control characteristics with full compensation at three temperatures.

In the figures like parts are identified by like numerals or letters.

DESCRIPTION OF THE PREFERRED EMBODIMENT

Figure 4:
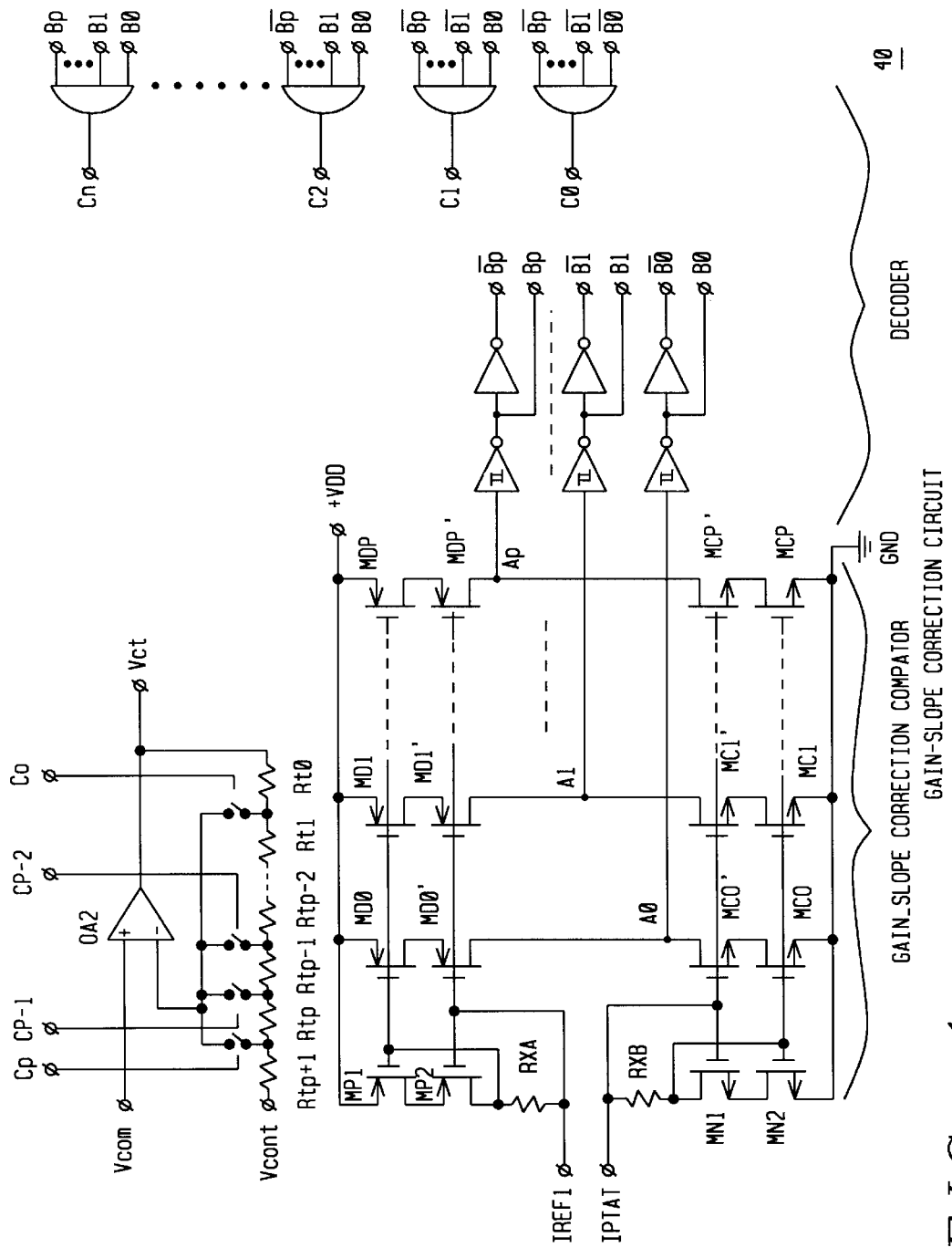
FIG. 4 is a circuit diagram of the preferred embodiment of a gain-slope correction circuit of the present invention.
Figure 5:
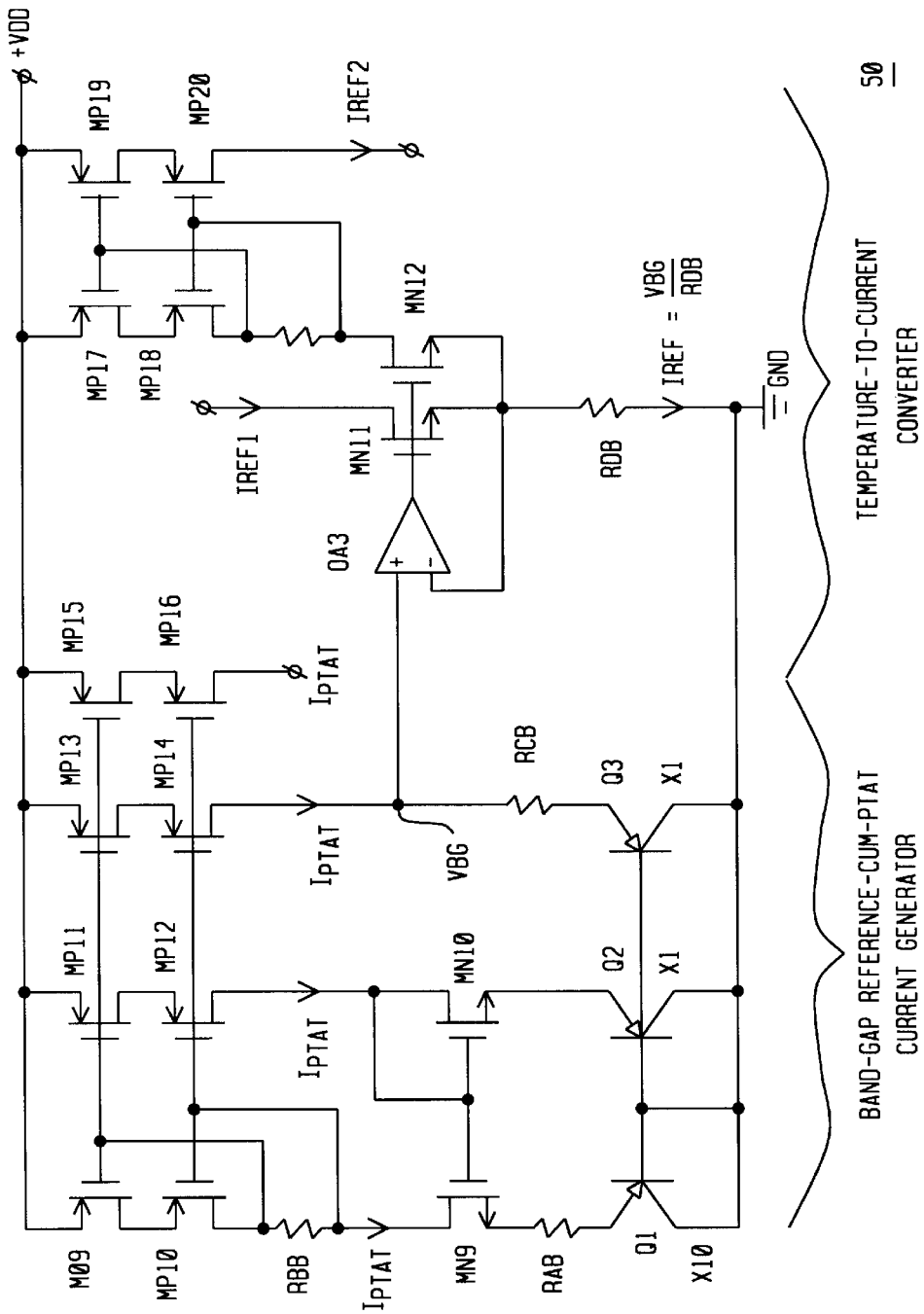
FIG. 5 is a circuit diagram of the preferred embodiment of a temperature sensing circuit of the present invention.
Figure 6:
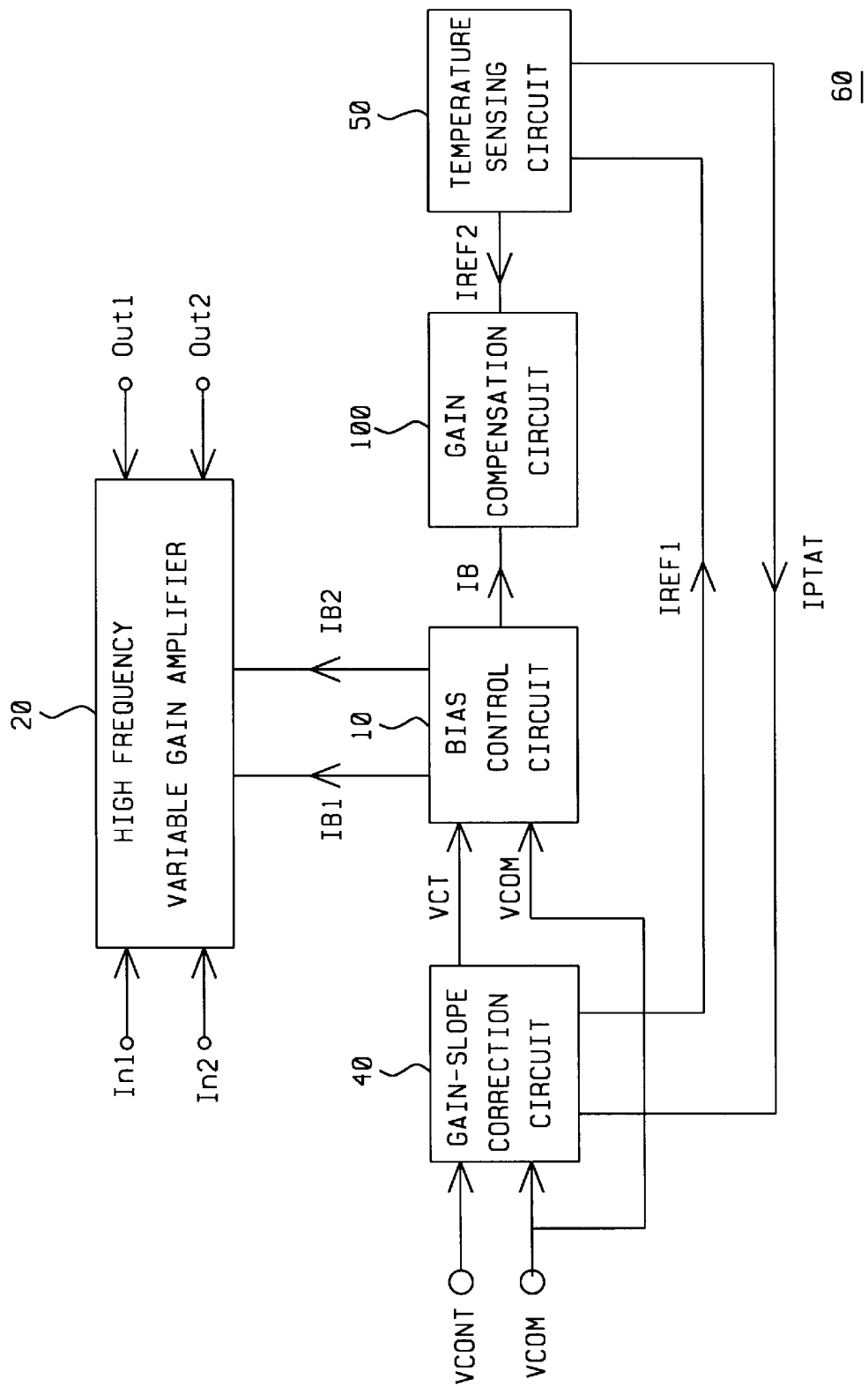
FIG. 6 is a block diagram of the preferred embodiment of the present invention.

A description of the present invention is given with reference to FIG. 6, FIGS. 2a, 2b, 3a, 3b, FIG. 1, FIG. 10, FIG. 5, and FIG. 4. FIG. 6 shows the block diagram of the linear-in-dB variable gain high frequency CMOS differential amplifier 60. It consists of five blocks, namely the high frequency variable gain amplifier 20, bias control circuit 10, gain compensation circuit 100, temperature sensing circuit 50, and gain-slope correction circuit 40. The detailed circuit diagrams for the respective blocks 20, 10, 100, 50, and 40 are shown in FIGS. 2a, 2b and FIGS. 3a, 3b (a first and a second preferred embodiment), FIG. 1, FIG. 10, FIG. 5, and FIG. 4, respectively. $V_{COM}$ is the analog common, and $V_{CONT}$ is the DC control voltage for the gain variation. The high frequency AC signal is applied differentially between In1 and In2 of the high frequency variable gain amplifier 20 and is available differentially, after amplification, between Out1 and Out2 of the same amplifier.

Bias Control Circuit

Figure 1:
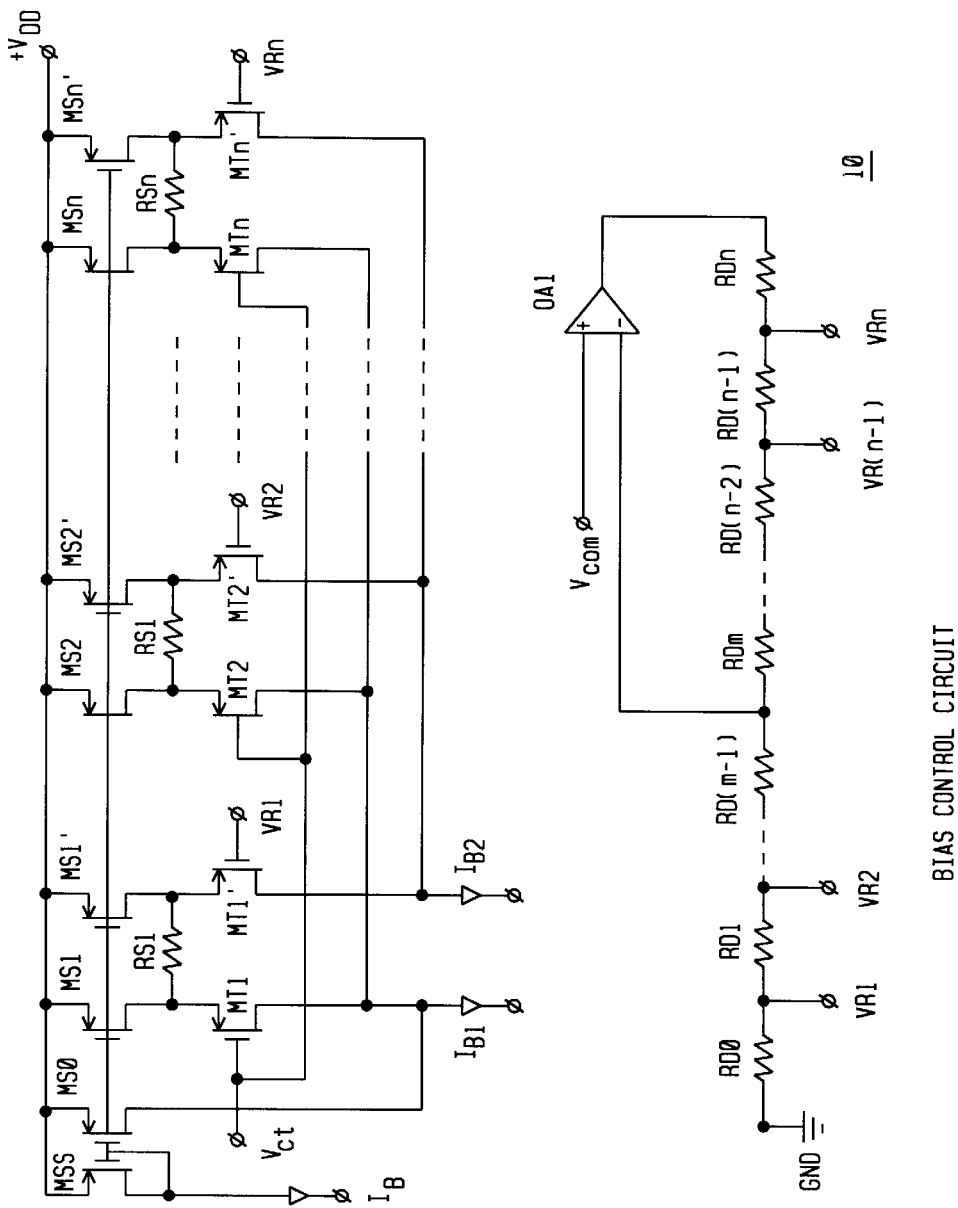
FIG. 1 is a circuit diagram of the preferred embodiment of the bias control circuit of the present invention.
Figure 2A:
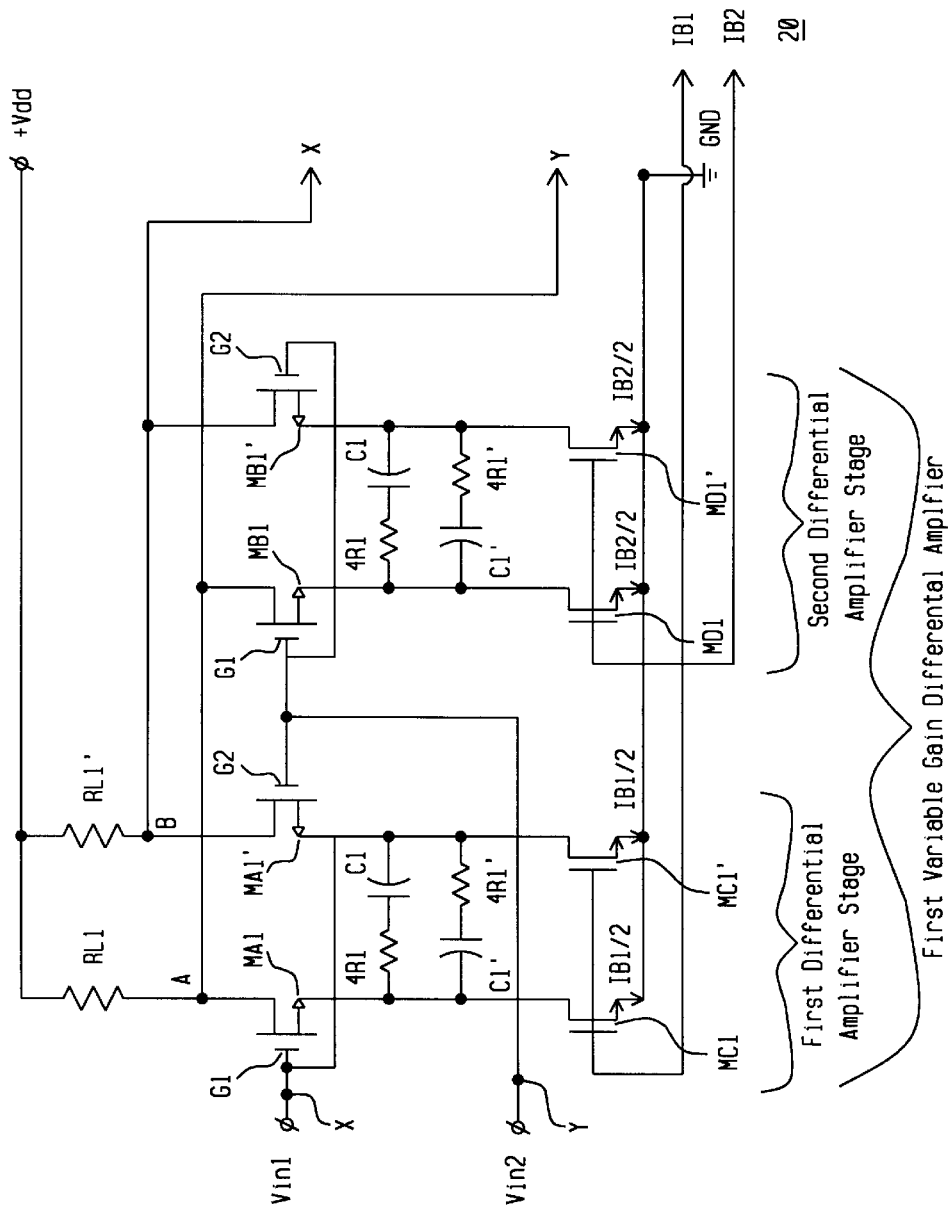
FIGS. 2a and 2b are a circuit diagram of a first preferred embodiment of a direct coupled high frequency variable gain amplifier of the present invention.
Figure 2B:
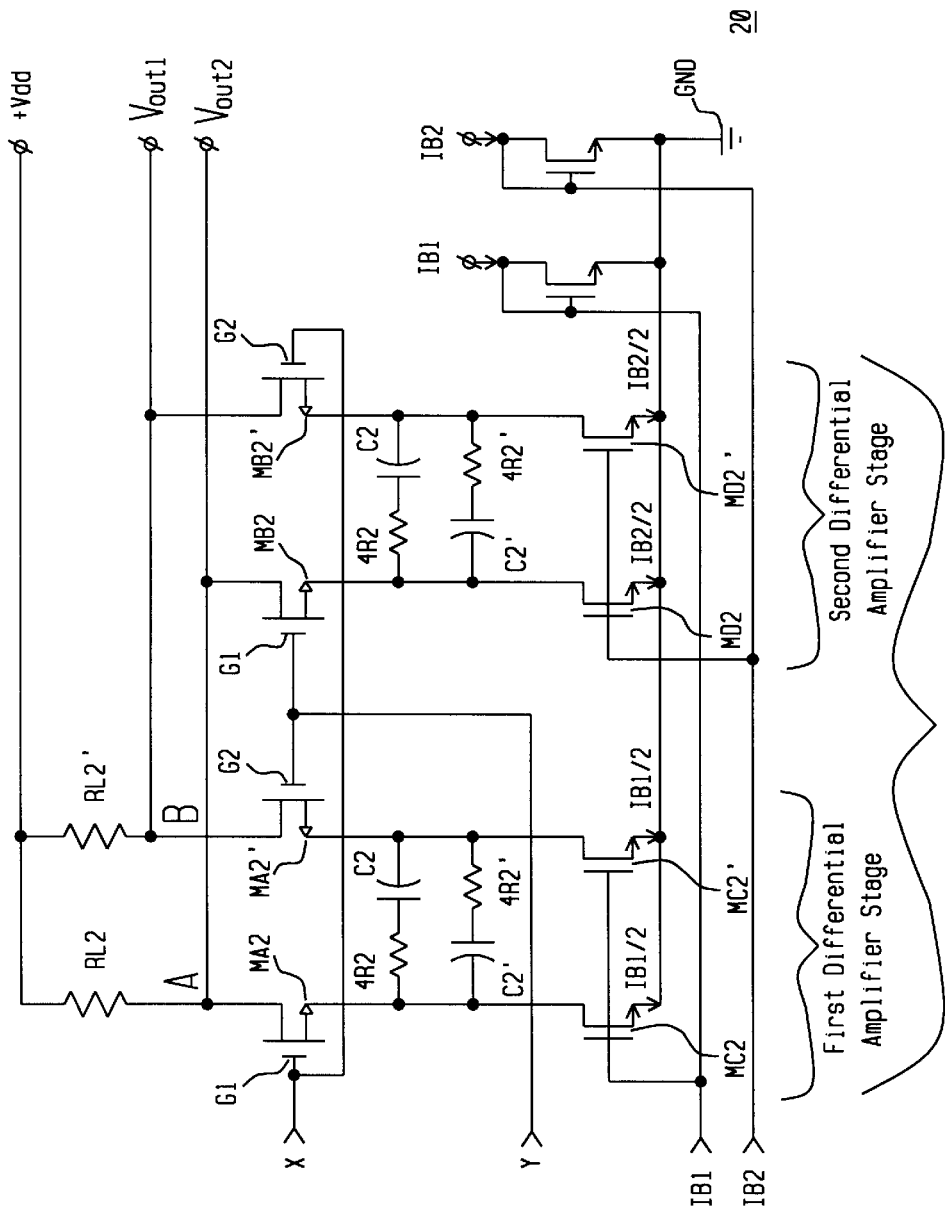
Figure 3A:
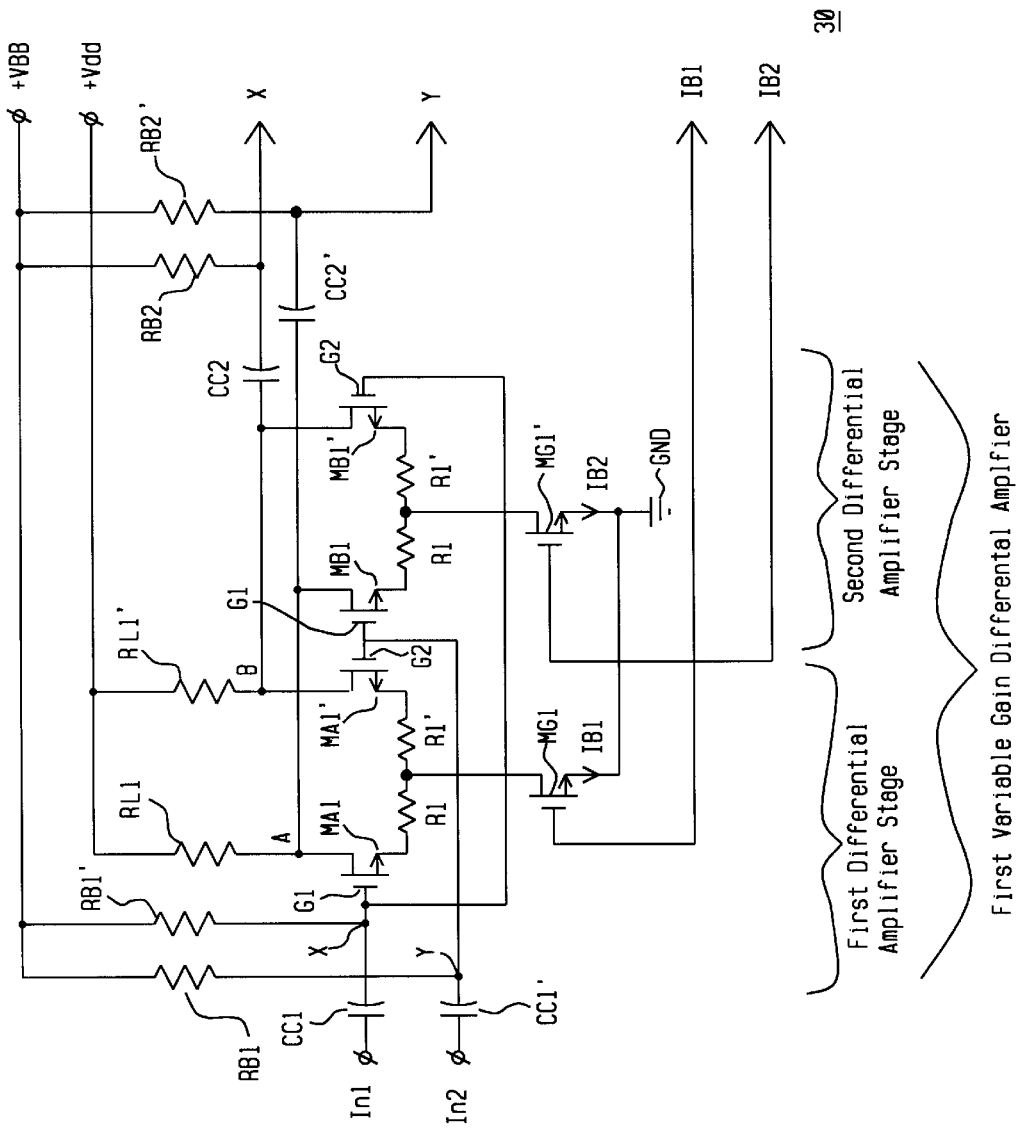
FIGS. 3a and 3b are a circuit diagram of a second preferred embodiment of a capacitor coupled high frequency variable gain amplifier of the present invention.
Figure 3B:
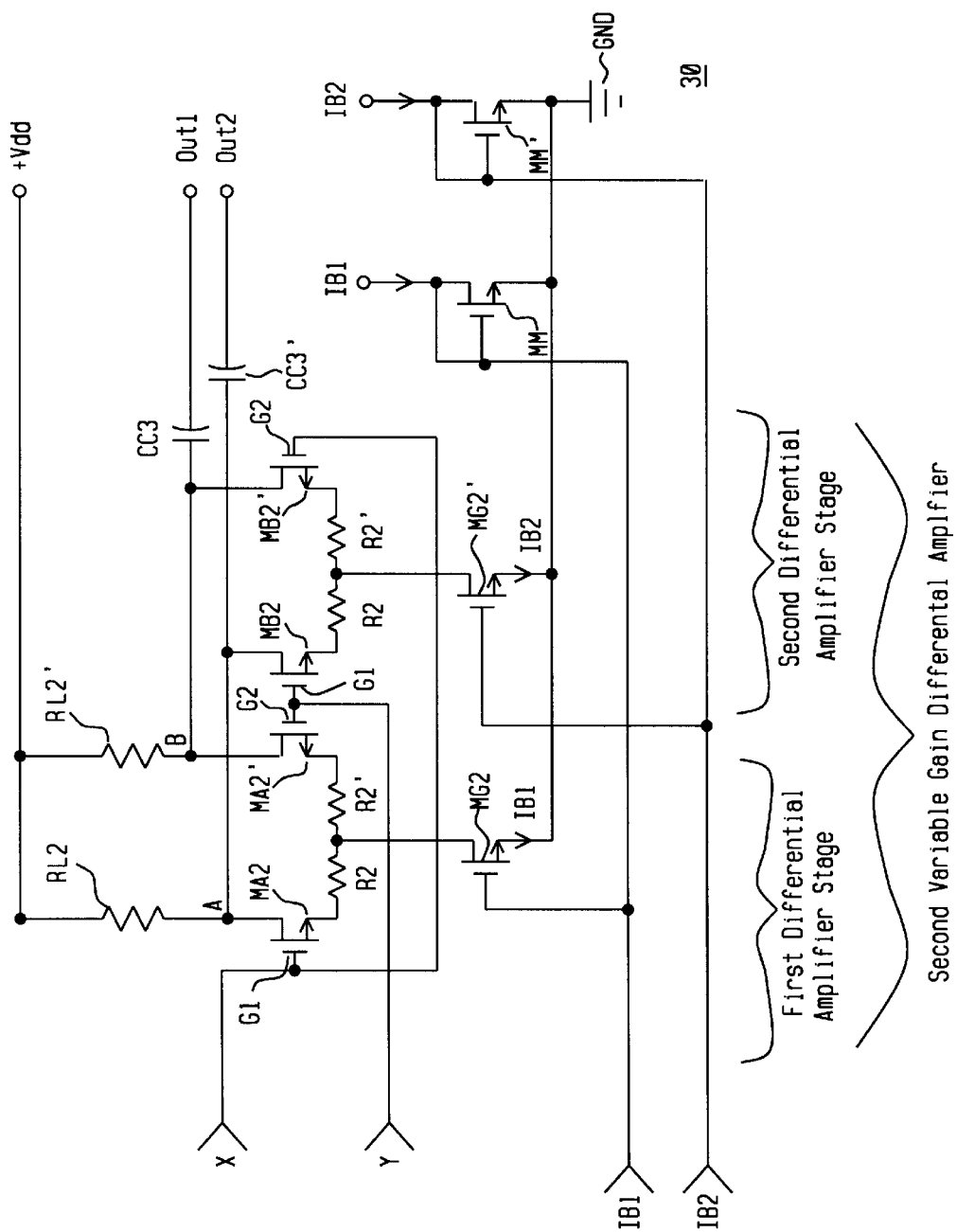

We now describe the bias control circuit 10 of FIG. 1. The input to the bias control circuit 10 is $V_{CT}$, which is nothing more but the control voltage $V_{CONT}$ modified by the gain-slope correction circuit and, for the time being, can be considered as the control voltage itself. The bias control circuit also takes a current input $I_B$ from the gain compensation circuit. The bias control circuit outputs two currents $I_{B1}$ and $I_{B2}$ which have the following relationship $$I_{B1} = mI_B \tag{1}$$

and $$I_{B2} = (1-m)I_B \tag{2}$$

where $$m = f(V_{CT}) \tag{3}$$

The current mirror transistors $M_{S0}$–$M_{Sn}$ in FIG. 1 are sized such that $I_{B1}$ and $I_{B2}$ always add up to $I_B$. The control voltage $V_{CT}$ is compared with reference voltages $V_{R1}$–$V_{Rn}$ and as it is increased, current is steered between the differential pairs $M_{T1}$–$M_{Tn}$ and, therefore, $I_{B2}$ increases with $I_{B1}$ decreasing. The magnitudes of the reference voltages, the current mirror transistor sizes and the resistors $R_{S1}$–$R_{Sn}$ is chosen such that $I_{B1}$, $I_{B2}$ can vary the gain of the variable gain amplifier in linear-in-dB fashion. These are determined by the Spice circuit analysis simulation. Therefore, it is obvious that m is a fractional number and a non-linear function (similar to exponential) of the control voltage $V_{CT}$. The reference voltages are generated from another input $V_{COM}$ with an operational amplifier $OA_1$ and resistor divider $R_{D0}$–$R_{Dn}$. The operation of a similar general purpose bias control circuit is explained in more detail in IME2000-021, the disclosure of which is incorporated herein by reference. However, in the preferred embodiment of the present invention the negative input of $OA_1$ is coupled to a point along the resistor divider $R_{D0}$–$R_{Dn}$ to amplify $V_{COM}$ at the output of $OA_1$. Which point is chosen, and therefore the amplification to be selected, depends on the value of and the design requirements. The output of $OA_1$ is determined by the term $$\left[1 + \frac{\sum_{i=m}^{n} R_{Di}}{\sum_{i=0}^{m-1} R_{Di}}\right] V_{COM}$$

i.e., the output is proportional to $V_{COM}$ and the ratio of the sum of the resistance between the connection point and the output over the sum of the resistance between the connection point and the reference voltage (typically ground).

Gain Compensation Circuit

Figure 10:
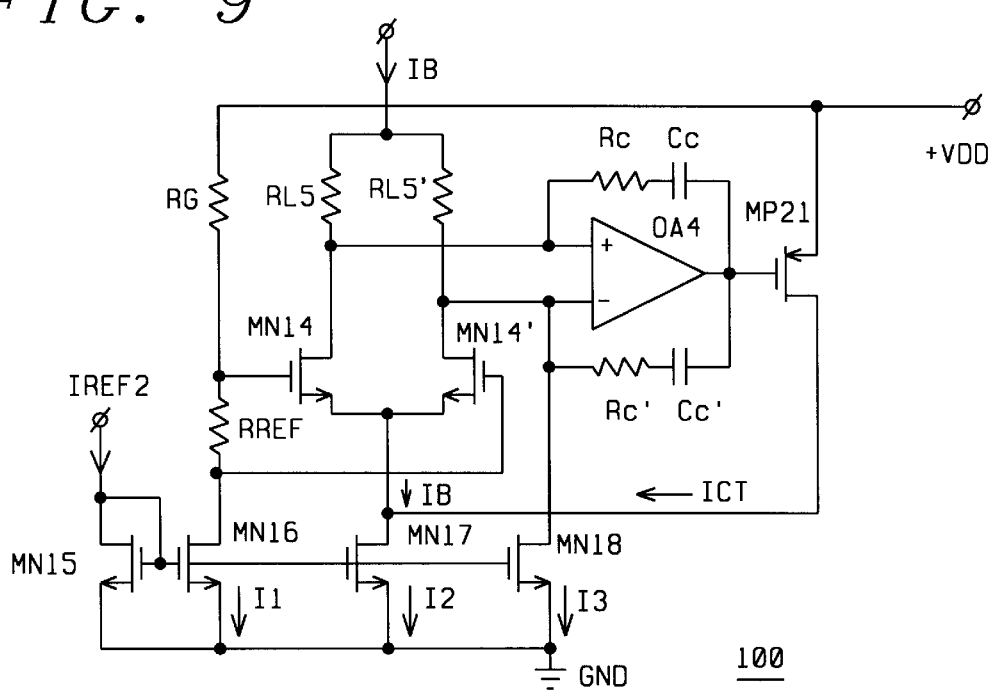
FIG. 10 is a circuit diagram of the preferred embodiment of a gain compensation circuit of the present invention.

The gain compensation circuit 100 of FIG. 10 takes in a temperature independent current $I_{REF2}$. It incorporates a differential transistor pair $M_{N14}$, $M_{N14}'$ of the same type as in the variable gain amplifier of FIGS. 2a, 2b and FIGS. 3a, 3b. A feedback loop is set up with an operational amplifier $OA_4$ to determine the tail current $I_B$ of this differential transistor pair such that $$(g_m)_{MN14} = \frac{(W/L)_{MN18}}{(W/L)_{MN16}} \left(\frac{1}{R_{REF}}\right) \tag{4}$$

The transconductance of $M_{N14}$ or $M_{N14}'$ in terms of $I_B$ is given by $$(g_m)_{MN14} = \sqrt{I_B \mu C_{OX} (W/L)_{MN14}} \tag{5}$$

combining (4) and (5) we can write:

$$(g_m)_{MN14} = \sqrt{I_B \mu C_{OX}(W/L)_{MN14}} = \frac{K_1}{R_{REF}} \quad (6)$$

where $K_1$ is a constant given by:

$$K_1 = (W/L)_{MN18}/(W/L)_{MN16} \quad (7)$$

A more detailed explanation of the gain compensation circuit can be found in IME patent IME2000-020, the disclosure of which is incorporated herein by reference.

High Frequency Variable Gain Amplifier

FIGS. 2a, 2b and FIGS. 3a, 3b show two preferred embodiments of the high frequency variable gain amplifier 20 of this invention with two stages each. However, more stages may be cascaded if higher gain is required. The transconductances of $M_{A1}$ and $M_{B1}$, with the help of (1), (2) and (6) is given by $$(g_m)_{MA1} = \sqrt{m I_B \mu C_{OX}(W/L)_{MA1}} = \frac{K_1 K_2 \sqrt{m}}{R_{REF}} \quad (8)$$

$$(g_m)_{MB1} = \sqrt{(1-m) I_B \mu C_{OX}(W/L)_{MB1}} = \frac{K_1 K_3 \sqrt{1-m}}{R_{REF}} \quad (9)$$

$$\text{where } K_2 = \sqrt{\frac{(W/L)_{MNA1}}{(W/L)_{MN14}}} \quad (10)$$

$$\text{and } K_3 = \sqrt{\frac{(W/L)_{MB1}}{(W/L)_{MN14}}} \quad (11)$$

The voltage of one stage of the amplifier 20 is given by $$A_{v1} = \frac{(g_m)_{MA1} R_{L1}}{1 + (g_m)_{MA1} R_1} - \frac{(g_m)_{MB1} R_{L1}}{1 + (g_m)_{MB1} R_1} \quad (12)$$

Using (8) and (9), (12) can be written as $$A_{v1} = \frac{K_1 K_2 K_4}{\frac{1}{\sqrt{m}} + K_1 K_2 K_5} - \frac{K_1 K_3 K_4}{\frac{1}{\sqrt{1-m}} + K_1 K_3 K_5} \quad (13)$$

$$\text{where } K_4 = \frac{R_{L1}}{R_{REF}} \quad (14)$$

$$\text{and } K_5 = \frac{R_1}{R_{REF}} \quad (15)$$

If $R_{L1}$, $R_1$ and $R_{REF}$ are the same type of resistors then $K_1$, $K_2$, $K_3$, $K_4$ and $K_5$ all are temperature and process independent constants. Then, from (13) and (3) we can see that the gain of any one stage of the variable gain amplifier is independent of temperature and process but changes with the control voltage $V_{CT}$. Therefore, the entire variable gain amplifier also has the same characteristic.

More detailed explanation of the high frequency variable gain amplifiers can be found in IME 2001-003, the disclosure of which is incorporated herein by reference.

Gain-slope Correction Circuit

It may seem from (13) that the amplifier 20 is fully compensated. However, this is not so since the parameter m has a temperature coefficient. If we consider the temperature characteristics of $I_B$, we will find that it increases with temperature to compensate for the reduction in mobility p with temperature. When this temperature dependent current $I_B$ is fed to the bias control circuit 10, it introduces a temperature dependency in the parameter m. This temperature dependency results in change in the slope of the gain control characteristic with temperature, as shown in FIG. 7.

This change in slope with temperature can be compensated by altering the $V_{CONT}$ with temperature. This function is performed by the gain-slope correction circuit 40. It converts $V_{CONT}$ to $V_{CT}$ by altering the amplification/attenuation of an operational amplifier $OA_2$ with temperature as illustrated in FIG. 4. This block takes in two currents $I_{REF1}$ and $I_{PTAT}$ from the temperature sensing circuit 50, discussed below. The former is a temperature independent reference current and the latter linearly increases with temperature. These two currents are compared using a series of current comparators formed with N-channel transistors $M_{C0}$–$M_{Cp}$ and P-channel transistors $M_{D0}$–$M_{Dp}$. Cascoded transistors are used to increase the gains of the comparators. The N-channel transistors have identical sizes but the sizes of the P-channel transistors increase progressively. The output $A_0$ of a comparator is high if $M_{D0}$ carries a higher current than $M_{C0}$. It can be analyzed that as the temperature increases, the outputs of the comparators $A_0$–$A_p$ go low progressively one by one. This means, the temperature of the chip has been digitized and the digital data is available at $A_0$–$A_p$.

The digital data is decoded using the digital gates and is used to control the switches $C_0$–$C_p$. These switches, with the help of resistors $R_{T0}$–$R_{T(p+1)}$ alter the feedback ratio of $OA_2$ with temperature, thus generating $V_{CT}$ from $V_{CONT}$. The Schmitt trigger inverters provide immunity against uncertain logic levels at the outputs $A_0$–$A_p$.

We describe now in more detail the gain-slope correction circuit 40 of FIG. 4. The gain-slope correction comparator comprises a series of current comparators formed with p-channel cascoded transistors $M_{D0}$, $M_{D1}$, $M_{D2}$, to $M_{Dp}$, and $M_{D0}'$, $M_{D1}'$, $M_{D2}'$, to $M_{Dp}'$, and n-channel cascoded transistors $M_{C0}$, $M_{C1}$, $M_{C2}$, to $M_{Cp}$, and $M_{C0}'$, $M_{C1}'$, $M_{C2}'$, to $M_{Cp}'$, which are serially coupled. The gates of the p-channel cascoded transistors are supplied by a current source comprising p-channel transistors $M_{P1}$ and $M_{P2}$ which are driven by a voltage drop generated by first reference current $I_{REF1}$ across resistor $R_{XA}$ which is connected between the drain of $M_{P2}$ and terminal $I_{REF1}$. The gates of the n-channel cascoded transistors are supplied by a current source comprising n-channel transistors $M_{N1}$ and $M_{N2}$ which are driven by a voltage drop generated by PTAT current $I_{PTAT}$ across resistor $R_{XB}$ which is connected between the drain of $M_{N2}$ and terminal $I_{PTAT}$. The junction of the p-channel cascoded and n-channel cascoded transistor, labeled $A_0$, $A_1$, $A_2$, to $A_p$, goes more positive when the p-channel cascoded transistors $M_{Di}$, $M_{Di}'$, carries a higher current than its serially coupled n-channel cascoded transistors $M_{Ci}$, $M_{Ci}'$.

A decoder is coupled via Schmitt triggers and power-up circuits/inverters to the junctions of the p-channel cascoded and n-channel cascoded transistors (nodes $A_0$, $A_1$, $A_2$, to $A_p$) and receives those digitized signals from the junctions, thus providing digital logic signal outputs $C_0$, $C_1$, $C_2$ to $C_{p-1}$, $C_p$, and ranging from all "zeros" to all "ones".

The decoder output feeds a feedback ratio circuit which alters the feedback ratio and thus the amplification-attenuation of operational amplifier OA2 with temperature. The feedback ratio circuit comprises further a series of control switches, equal in number to the number of outputs from said decoder (0 to p equals p+1), activated by the logic signal outputs, where one terminal side of every control switch is ganged together into one line and connected to the negative input of OA2. The positive input of OA2 is coupled to the second control voltage $V_{COM}$. The output of OA2 provides output voltage $V_{CT}$ to the bias control circuit 10. A serially coupled string of resistors $R_{T0}$, $R_{T1}$, $R_{T2}$, to $R_{Tp-1}$, $R_{Tp}$, $R_{Tp+1}$, thus numbering one more than the number of logic signal outputs of the decoder, is coupled between the first control voltage $V_{CONT}$ and the output of OA2, where $R_{T0}$ is connected to the output of OA2. The other terminals of the control switches are coupled to the string of resistors, such that the first control switch is coupled between the first and the second resistor $R_{T0}$ and $R_{T1}$, and the last control switch is coupled between the next-to-last and last resistors $R_{Tp}$ and $R_{Tp+1}$. All switches are implemented with transmission gates.

Temperature Sensing Circuit

The temperature sensing circuit 50 of FIG. 5 generates three currents: $I_{REF1}$, $I_{REF2}$, and $I_{PTAT}$. $I_{REF1}$ and $I_{REF2}$ are temperature independent reference currents. $I_{PTAT}$ is a current that increases linearly with temperature. $M_{P9}$–$M_{P14}$, $M_{N9}$–$M_{N10}$, $Q_1$–$Q_3$, $R_{AB}$–$R_{CB}$ in FIG. 5 form a band-gap reference-cum-PTAT current generator. A band-gap voltage of approximately 1.2V is available at $V_{BG}$. The PTAT current $I_{PTAT}$ is mirrored out using $M_{P15}$–$M_{P16}$.

The collector current $I_C$ for a bipolar transistor is given by:

$$I_C = I_0 A \exp\left[\frac{V_{BE}}{V_T}\right] \quad (16)$$

where $I_0$ is the reverse saturation current of the base-emitter junction per unit area, A is the emitter area, $V_{BE}$ is the base-emitter voltage, $V_T = kT/q$ is the thermal voltage, k is the Boltzmann's constant, T is the temperature in ° K, and q is the electronic charge. From (16) we can obtain the expression of $V_{BE}$ in terms of $I_C$ as $$V_{BE} = V_T \ln\left[\frac{I_C}{I_0 A}\right] \quad (17)$$

In FIG. 5, equal sized mirror transistors $M_{P9}$–$M_{P12}$ together with equal sized cascode transistors $M_{N9}$–$M_{N10}$ force the currents through the bipolar transistors $Q_1$ and $Q_2$ to be equal. As a result, $V_{GS}$ of $M_{N9}$ and $M_{N10}$ are equal. However, it follows from (17) that the $V_{BE}$s of $Q_1$ and $Q_2$ are not equal because of the difference in their emitter sizes, $A_1$ and $A_2$, respectively. Mirror transistors $M_{P13}$–$M_{P16}$ are also sized equal and identical to $M_{P9}$–$M_{P12}$. Therefore, it is obvious that the currents through $Q_1$ and $Q_2$ are both equal to $I_{PTAT}$. Applying Kirchhoff's Voltage Law around the gate-sources of $M_{N9}$ and $M_{N10}$ and base-emitters of $Q_1$ and $Q_2$ and $R_{AB}$, we have $$I_{PTAT} R_{AB} = (V_{BE})_{Q2} - (V_{BE})_{Q1} \quad (18)$$

Combining (17) and (18) we have $$I_{PTAT} R_{AB} = V_T \ln\left[\frac{I_{PTAT}}{I_0 A_2}\right] - V_T \ln\left[\frac{I_{PTAT}}{I_0 A_1}\right] = V_T \ln\left[\frac{A_1}{A_2}\right]$$

from which it follows that $$I_{PTAT} = \frac{V_T \ln\left[\frac{A_1}{A_2}\right]}{R_{AB}} \quad (19)$$

It can be noted that the magnitude of $I_{PTAT}$ can be set by either $R_{AB}$ or the emitter area ratio $A_1/A_2$ of $Q_1$ to $Q_2$, which is shown as 10 in FIG. 5. The base-emitter voltage of a bipolar transistor, neglecting the second and higher order terms, can be written as $$V_{BE} \cong V_{G0} - BT \quad (20)$$

where $V_{G0}$ is a constant equal to the silicon band-gap voltage, T is the temperature in ° K, and B is another constant. From FIG. 5, we can write $$V_{BG} = (V_{BE})_{Q3} + I_{PTAT} R_{CB} \quad (21)$$

Combining (19), (20), and (21) we can write $$V_{BE} = V_{G0} - BT + \left(\frac{R_{CB}}{R_{AB}}\right) V_T \ln\left[\frac{A_1}{A_2}\right] \quad (22)$$

It can be seen from (22) that by appropriately adjusting the ratio of $R_{CB}$ to $R_{AB}$, i.e., choosing $(R_{CB}/R_{AB})(k/q)\ln(A_1/A_2)=B$, it is possible to remove any temperature or process dependency in $V_{BG}$ such that $$V_{BG} = V_{G0} \quad (23)$$

The band-gap voltage $V_{BG}$ is further converted into a nearly temperature independent current $I_{REF}$ using the operational amplifier $OA_3$ and resistor $R_{DB}$. $V_{BG}$ is applied to the non-inverting terminal of $OA_3$, and $R_{DB}$ is connected from its inverting terminal to ground. The negative feedback around $OA_3$ through gate-source of $M_{N11}$, $M_{N12}$ ensures that the voltage at its inverting terminal will also be equal to $V_{BG}$ and, therefore, it follows that $$I_{REF} = \frac{V_{BG}}{R_{DB}} \quad (24)$$

The current $I_{REF}$ flowing through $R_{DB}$ is split into two parts $I_{REF1}$ and $I_{REF2}$ using $M_{N11}$–$M_{N12}$ in the ratio of the latter's aspect ratios. $I_{REF2}$ is mirrored out in the proper direction using the cascode mirror $M_{P17}$–$M_{P20}$. Resistors $R_{AB}$, $R_{CB}$ and $R_{DB}$ must be of the same type for good circuit performance. This is also required for a good comparison of $I_{PTAT}$ and $I_{REF1}$ in the gain-slope correction circuit since the currents depend on resistors as given in (19) and (24). Usually, the on-chip resistors have a slight temperature dependence. The reason for using a common band-gap and PTAT circuit is to ensure good $I_{REF1}$ and $I_{PTAT}$ tracking with changes in the characteristics of the bipolar transistors $Q_1$–$Q_3$, which are not so stable in a CMOS process.

Still referring FIG. 5, we describe in more detail some aspects of the temperature sensing circuit 50. The band-gap reference-cum-PTAT current generator section comprises a current source with transistors $M_{P9}$ and $M_{P10}$ connected serially. The current source is driven by the voltage drop across resistor $R_{BB}$ which is serially coupled between the drain of $M_{P10}$ and transistor $M_{N9}$ of a current source comprising transistors $M_{N9}$ and $M_{N10}$. The source of $M_{N9}$ is coupled via resistor $R_{AB}$ to the emitter of bipolar transistor $Q_1$. Transistor $Q_1$ is the current source for current mirror transistors $Q_2$ and $Q_3$. Transistors $M_{P11}$ to $M_{P16}$ are cascoded mirrored current sources of $M_{P9}$ and $M_{P10}$, respectively. The drain of $M_{12}$ is coupled serially via $M_{N10}$ to the emitter of $Q_2$. The drain of $M_{P14}$ is coupled serially via resistor $R_{CB}$ to the emitter of $Q_3$. The junction of $M_{P14}$ and resistor $R_{CB}$ is node $V_{BG}$ which provides a band-gap voltage of about 1.2 volt, as mentioned earlier. The drain of $M_{P16}$ provides the PTAT current $I_{PTAT}$ for gain compensation circuit 100.

The temperature-to-current converter (TTC) section of FIG. 5 comprises operational amplifier OA3, NMOS transistors $M_{N11}$–$M_{N12}$, PMOS transistors $M_{P17}$–$M_{P20}$, and resistor $R_{EB}$. The output of OA3 is coupled to the gates of first and a second voltage-to-current converter (VTCC) MOS transistors $M_{N11}$ and $M_{N12}$. Their sources are coupled to the negative input of OA3 providing feedback, and via resistor $R_{DB}$ to a power supply return. The current through resistor $R_{DB}$ is the prime current reference $I_{REF}$ The drain of $M_{N11}$ is the source of the first bias current $I_{REF1}$ for gain-slope correction circuit 40. The drain of $M_{N12}$ is coupled via resistor $R_{EB}$ to the transistors $M_{P17}$ and $M_{P18}$, which form a current source for current mirrors $M_{P19}$ and $M_{P20}$. The drain of $M_{P20}$ is the source the second bias current $I_{REF2}$ for gain compensation circuit 100.

Simulation Results

Figure 9:
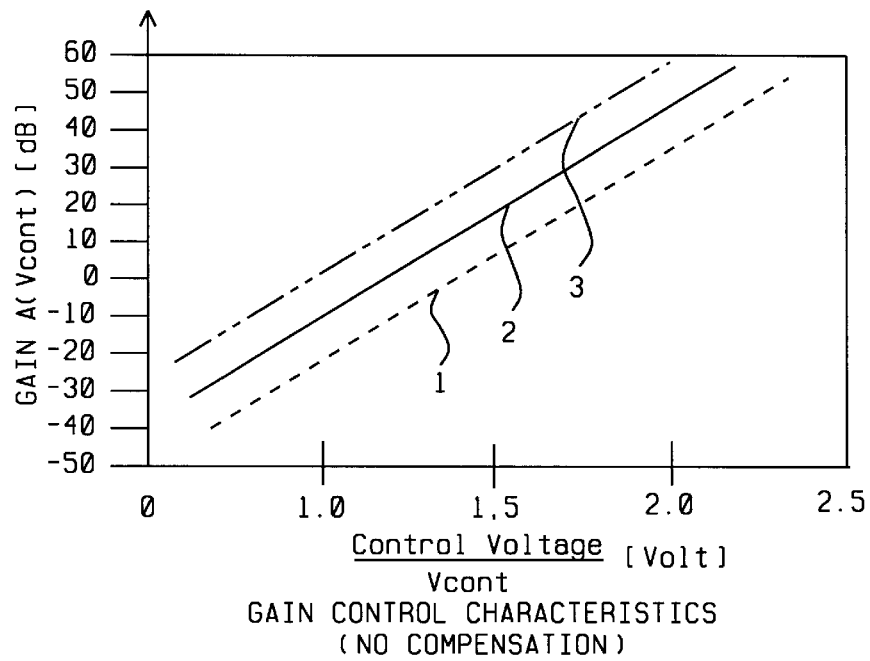
FIG. 9 is a graph of the high frequency CMOS differential amplifier gain control characteristics with no compensation at three temperatures.

FIG. 7, FIG. 8, and FIG. 9 show simulation graphs of the typical gain control characteristics under different conditions.

FIG. 9 is a graph showing the gain control characteristics without any compensation at all, where the control voltage $V_{CONT}$ in volts on the X axis is plotted against the high frequency CMOS differential amplifier voltage gain A in dB on the Y axis. Curves 1,2, and 3 shows the response at a circuit temperature of +85° C., +25° C., and −35° C., respectively. Here the bias control circuit 10 takes in $V_{CONT}$ instead of $V_{CT}$, and $I_{REF2}$ instead of $I_{B1}$ and $I_{B2}$. FIG. 7 shows the same set of curves as FIG. 9 (with the same conditions) but without gain-slope correction (partial compensation). Note that in this case the bias control circuit 10 takes in $V_{CONT}$ instead of $V_{CT}$ but makes use of $I_{B1}$ and $I_{B2}$ as usual. FIG. 8 again shows the same set of curves as FIG. 9, but shows the fully compensated characteristics (i.e., bias control circuit 10 takes in $V_{CT}$, and $I_{B1}$ and $I_{B2}$). It is obvious from inspection of FIGS. 9, 7, and 8 that the full compensation of FIG. 8 illustrates a significantly improved gain control characteristics.

While the invention has been particularly shown and described with reference to the preferred embodiments thereof, it will be understood by those skilled in the art that various changes in form and details may be made without departing from the spirit and scope of the invention.

What is claimed is:

1. A high frequency CMOS differential amplifier, comprising:
    a high frequency variable gain amplifier for providing a differential variable gain amplification of a first and a second input signal, where the gain of said high frequency variable gain amplifier depends on a first and a second bias current applied to said high frequency variable gain amplifier, said high frequency variable gain amplifier comprising at least two differential amplifiers;
    a temperature sensing circuit for providing a band-gap reference voltage plus proportional to absolute temperature (PTAT) dependent current generator, and a temperature independent first and second reference current;
    a gain-slope correction circuit for receiving a first and a second control voltage, said temperature independent first reference current and said temperature PTAT dependent current and producing an intermediate control voltage as a function of temperature by comparing said temperature independent first reference current and said PTAT dependent current, thereby compensating for a change in slope of the gain control characteristics with temperature of said high frequency variable gain amplifier;
    a gain compensation circuit for receiving said temperature independent second reference current, and a biasing current which is modified to correct the temperature/process dependency of said variable gain amplifier; and
    a bias control circuit for receiving said intermediate control voltage, said second control voltage, and said biasing current and producing said first and said second bias current by comparing said intermediate control voltage against reference voltages.

2. The CMOS differential amplifier of claim 1, wherein the gain of said high frequency variable gain amplifier is independent of temperature and process.

3. The CMOS differential amplifier of claim 1, wherein said high frequency variable gain amplifier comprises:
    a first and a second differential amplifier, each having an input X and an input Y and output node A and node B, where said input X and said input Y of said first differential amplifier is coupled to an input Vin1 and an input Vin2, respectively, where said input X and said input Y of said second differential amplifier is direct-coupled to said node B and said node A of said first differential amplifier, respectively, where said node B and said node A of said second differential amplifier is coupled to an output Vout1 and an output Vout2, respectively, said first and said second differential amplifier together providing a variable gain at said outputs Vout1 and Vout2 based on signals applied to said inputs Vin1 and Vin2, said first and said second differential amplifier each further comprising:
        a first and a second differential amplifier stage coupled together, each having an input G1 and an input G2 and said node A and said node B, said nodes A coupled together and said nodes B coupled together, where said input G1 and said input G2 of said first differential amplifier stage are coupled to said input X and said input Y, respectively, where said input G1 and said input G2 of said second differential amplifier stage is coupled to said input Y and said input X, respectively, said first and said second differential amplifier stage together providing a variable gain at said node A and said node B, based on signals applied to said input X and said input Y, said first and said second differential amplifier stage each further comprising:
            a first differential transistor pair comprising a first and a second transistor, said first and said second transistor in communication with a first and a second current source, respectively, said first and said second current source controlled by said first bias current; and
            a second differential transistor pair comprising a third and a fourth transistor, said third and said fourth transistor in communication with a third and a fourth current source, respectively, said third and said fourth current source controlled by said second bias current.

4. The CMOS differential amplifier of claim 1, wherein said high frequency variable gain amplifier comprises:

a first and a second differential amplifier, each having an input X and an input Y and output node A and node B, where said input X and said input Y of said first differential amplifier is coupled to an input Vin1 and an input Vin2, respectively, where said input X and said input Y of said second differential amplifier is capacitor-coupled to said node B and said node A of said first differential amplifier, respectively, where said node B and said node A of said second differential amplifier is coupled to an output Out1 and an output Out2, respectively, said first and said second differential amplifier together providing a variable gain at said outputs Out1 and Out2 based on signals applied to said inputs In1 and In2, said first and said second differential amplifier each further comprising:

a first and a second differential amplifier stage coupled together, each having an input G1 and an input G2 and said node A and said node B, said nodes A coupled together and said nodes B coupled together, where said input G1 and said input G2 of said first differential amplifier stage are coupled to said input X and said input Y, respectively, where said input G1 and said input G2 of said second differential amplifier stage is coupled to said input Y and said input X, respectively, said first and said second differential amplifier stage together providing a variable gain at said node A and said node B, based on signals applied to said input X and said input Y, said first and said second differential amplifier stage each further comprising:

a first differential transistor pair comprising a first and a second transistor, the source of said first and said second transistor in communication with a first current mirror, said first current source controlled by said first bias current; and a second differential transistor pair comprising a third and a fourth transistor, the source of said third and said fourth transistor in communication with a second current mirror, said second current mirror controlled by said second bias current.

5. The CMOS differential amplifier of claim 1, wherein said bias control circuit comprises:

a biasing current source controlled by said biasing current, said biasing current source coupled between said voltage supply and said biasing current input, where the gate of said biasing current source is coupled to the gates of a plurality of current mirror pairs and a bias current mirror;

a plurality of bias control differential amplifiers, each comprising a pair of MOS transistors, sources of said pair of MOS transistors coupled via said current mirror pairs, respectively, to a voltage supply, bias control resistive means coupled between the sources of each pair of said MOS transistors such that current from any part of either current mirror pair can flow through either transistor of said MOS transistor pair, the gates of the first MOS transistor of each pair coupled to said intermediate control voltage, the drains of said first MOS transistor of each pair coupled to said first bias current input and to said bias current mirror, the drains of said second MOS transistor of each pair coupled to said second bias current input;

a first operational amplifier having a positive and a negative input, said positive input of said first operational amplifier coupled to said second control voltage, the output and said negative input of said first operational amplifier coupled together to provide feedback; and a plurality of voltage reference resistive means coupled in series between a reference supply and the output of said first operational amplifier, where the number of said voltage reference resistive means is one more than the number of said bias control differential amplifiers, where the junction of the first and the second voltage reference resistive means is coupled to the gate of said second MOS transistor of the first pair of MOS transistors, where the junction of the second and the third voltage reference resistive means is coupled to the gate of said second MOS transistor of the second pair of MOS transistors, and continuing similarly till where the junction of the nth and the nth-plus-one voltage reference resistive means is coupled to the gate of said second MOS transistor of the nth pair of MOS transistors, said junctions of said voltage reference resistive means providing reference voltages to their respective transistor gates.

6. The bias control circuit of claim 5, wherein the relationship between said first and said second bias current is expressed by the equations:

$$I_{B1}=mI_B$$

and $$I_{B2}=(1-m)I_B$$

where:

$$m=f(V_{CT})$$

where:

$I_{B1}$ is said first bias current, $I_{B2}$ is said second bias current, $V_{CT}$ is said intermediate control voltage.

7. The bias control circuit of claim 5, wherein the size of the transistors of each of said current mirror pairs are chosen such that said first and said second bias current always equals said biasing current.

8. The bias control circuit of claim 5, wherein the size of the transistors of each of said current mirror pairs, the magnitude of said reference voltages, and said bias control resistive means are chosen such that said first and said second bias current can vary the gain of said high frequency variable gain amplifier in linear-in-dB fashion.

9. The CMOS differential amplifier of claim 1, wherein said gain-slope correction circuit comprises:

a gain-slope correction comparator used to comparing said temperature independent first reference current with said PTAT dependent current and digitizing the comparison, said gain-slope correction comparator further comprising:

a series of current comparators formed with p-channel cascoded and n-channel cascoded transistors serially coupled, where the gates of said p-channel cascoded transistors are driven by a voltage drop generated by said first reference current across a first gain-slope correction resistive means, and where the gates of said n-channel cascoded transistors are driven by a voltage drop generated by said PTAT current across a second gain-slope correction resistive means, a junction of said p-channel cascoded and n-channel cascoded transistor going more positive when said p-channel cascoded transistor carries a higher current than its serially coupled n-channel cascoded transistor;

a decoder coupled to the junctions of said p-channel cascoded and n-channel cascoded transistors for receiving digitized signals from said junctions thus providing digital logic signal outputs ranging from all "zeros" to all "ones";

a feedback ratio circuit for altering the feedback ratio and thus the amplification-attenuation of a second operational amplifier with temperature, said feedback ratio circuit further comprising:

a series of control switches, equal in number to the number of outputs from said decoder, activated by said logic signal outputs, where one terminal of all of said control switches is ganged together into one line;

said second operational amplifier for receiving at its negative input said ganged together line, and for receiving at its positive input said second control voltage; and a serially coupled string of temperature control resistive means, numbering one more than the number of logic signal outputs of said decoder, coupled between said first control voltage and the output of said second operational amplifier, where the other terminal of said first control switch is coupled between the first and the second temperature control resistive means, where the other terminal of said second control switch is coupled between the second and the third temperature control resistive means, and so on, till the other terminal of said last control switch is coupled between the next-to-last and last temperature control resistive means.

10. The gain-slope correction circuit of claim 9, wherein said n-channel cascoded transistors have identical sizes.

11. The gain-slope correction circuit of claim 9, wherein said p-channel cascoded transistors have progressively increasing sizes.

12. The gain-slope correction circuit of claim 9, wherein the junctions of said n-channel cascode and p-channel cascode transistors go one-by-one progressively low in voltage as the temperature of the functional circuits increases.

13. The CMOS differential amplifier of claim 1, wherein said temperature sensing circuit comprises:

a band-gap reference-cum-PTAT current generator for generating a temperature independent band-gap voltage node of about 1.2 volt, and for providing said PTAT dependent current which increases linearly with temperature;

a temperature-to-current converter (TTC) for converting said band-gap voltage into a nearly temperature independent prime current reference $I_{REF}$, and for splitting said prime current reference $I_{REF}$ into said first and said second reference current, said TTC further comprising:

a third operational amplifier having a negative and a positive input, and an output, the positive input of said third operational amplifier coupled to said 1.2 volt bandgap voltage node; and a first and a second voltage-to-current converter (VTCC) MOS transistor, the gates of said first and said second VTCC MOS transistor coupled to the output of said third operational amplifier, the source said first and said second VTCC coupled to the negative input of said third operational amplifier to provide feedback, the source said first and said second VTCC additionally in communication with a reference potential via a prime reference resistive means, where the drain of said first VTCC MOS transistor provides said prime current reference $I_{REF}$, and where the drain of said second VTCC MOS transistor is the current source for said second bias current.

14. The CMOS differential amplifier of claim 1, wherein said gain compensation circuit comprises:

a gain compensation differential amplifier comprising a differentially arranged MOS transistor pair, each MOS transistor of said MOS transistor pair coupled via a load resistive means to said biasing current input, the sources of said MOS transistor pair joined together into a junction;

a gain compensation current source coupled with its drain and gate to said second reference current for driving a first, a second, and a third gain compensation current mirror;

a gate resistive means serially coupled to a gain compensation resistive means, thus forming a voltage divider, where said gate resistive means is coupled to a voltage supply, and where said gain compensation resistive means is coupled to said first gain compensation current mirror, the voltage drop across said gain compensation resistive means providing the input voltage to the gates of said MOS transistor pair;

a fourth operational amplifier having a positive and a negative input, where one input is coupled to one drain and the other input is coupled to the other drain of said MOS transistor pair;

a control PMOS transistor coupled between said voltage supply and said junction of said MOS transistor pair, where the gate of said control PMOS transistor is coupled to the output of said fourth operational amplifier;

said second gain compensation current mirror coupled to said junction of said MOS transistor pair, where the tail current, equal to said biasing current, flowing out of the sources of said MOS transistor pair is diminished by the compensation current flowing out of the drain of said PMOS transistor, thus controlling said biasing current as a function of process variations; and said third gain compensation current mirror coupled to said negative input of said fourth operational amplifier.

15. A high frequency CMOS differential amplifier, comprising:

a high frequency variable gain amplifier for providing a differential variable gain amplification of a first and a second input signal, where the gain of said high frequency variable gain amplifier depends on a first and a second bias current applied to said high frequency variable gain amplifier, said high frequency variable gain amplifier comprising at least two differential amplifiers, where the gain of said high frequency variable gain amplifier is independent of temperature and process;

a bias control circuit for receiving an intermediate control voltage, a second control voltage, and a biasing current and producing said first and said second bias current by comparing said intermediate control voltage against reference voltages, where said reference voltages are generated by said bias control circuit from said second control voltage and a first operational amplifier;

a gain-slope correction circuit for receiving a first control voltage, said second control voltage, a temperature independent first reference current, and a proportional to absolute temperature (PTAT) dependent current and producing said intermediate control voltage as a function of temperature by comparing said temperature independent first reference current and said PTAT dependent current, thereby compensating for a change in slope of the gain control characteristics with temperature of said high frequency variable gain amplifier, said gain-slope correction circuit further comprising:
a gain-slope correction comparator used to comparing said temperature independent first reference current with said PTAT dependent current and digitizing the comparison, said gain-slope correction comparator further comprising:
a series of current comparators formed with p-channel cascoded and n-channel cascoded transistors serially coupled, where the gates of said p-channel cascoded transistors are driven by a voltage drop generated by said first reference current across a first gain-slope correction resistive means, and where the gates of said n-channel cascoded transistors are driven by a voltage drop generated by said PTAT current across a second gain-slope correction resistive means, a junction of said p-channel cascoded and n-channel cascoded transistor going more positive when said p-channel cascoded transistor carries a higher current than its serially coupled n-channel cascoded transistor;
a decoder coupled to the junctions of said p-channel cascoded and n-channel cascoded transistors for receiving digitized signals from said junctions thus providing digital logic signal outputs ranging from all "zeros" to all "ones";
a feedback ratio circuit for altering the feedback ratio and thus the amplification-attenuation of a second operational amplifier with temperature, said feedback ratio circuit further comprising:
a series of control switches, equal in number to the number of outputs from said decoder, activated by said logic signal outputs, where one terminal of all of said control switches is ganged together into one line;
said second operational amplifier for receiving at its negative input said ganged together line, and for receiving at its positive input said second control voltage;
a serially coupled string of temperature control resistive means, numbering one more than the number of logic signal outputs of said decoder, coupled between said first control voltage and the output of said second operational amplifier, where the other terminal of said first control switch is coupled between the first and the second temperature control resistive means, where the other terminal of said second control switch is coupled between the second and the third temperature control resistive means, and so on, till the other terminal of said last control switch is coupled between the next-to-last and last temperature control resistive means;
a temperature sensing circuit for providing said band-gap reference voltage plus proportional to absolute temperature (PTAT) dependent current generator, and said temperature independent first and second reference current; and
a gain compensation circuit for receiving said temperature independent second reference current, and said biasing current, which is modified to correct the temperature/process dependency of said variable gain amplifier.

16. The gain-slope correction circuit of claim 15, wherein said n-channel cascoded transistors have identical sizes.

17. The gain-slope correction circuit of claim 15, wherein said p-channel cascoded transistors have progressively increasing sizes.

18. The gain-slope correction circuit of claim 15, wherein the junctions of said n-channel cascode and p-channel cascode transistors go one-by-one progressively low in voltage as the temperature of the functional circuits increases.

19. The CMOS differential amplifier of claim 15, wherein said high frequency variable gain amplifier comprises:
a first and a second differential amplifier, each having an input X and an input Y and output node A and node B, where said input X and said input Y of said first differential amplifier is coupled to an input Vin1 and an input Vin2, respectively, where said input X and said input Y of said second differential amplifier is direct-coupled to said node B and said node A of said first differential amplifier, respectively, where said node B and said node A of said second differential amplifier is coupled to an output Vout1 and an output Vout2, respectively, said first and said second differential amplifier together providing a variable gain at said outputs Vout1 and Vout2 based on signals applied to said inputs Vin1 and Vin2, said first and said second differential amplifier each further comprising:
a first and a second differential amplifier stage coupled together, each having an input G1 and an input G2 and said node A and said node B, said nodes A coupled together and said nodes B coupled together, where said input G1 and said input G2 of said first differential amplifier stage are coupled to said input X and said input Y, respectively, where said input G1 and said input G2 of said second differential amplifier stage is coupled to said input Y and said input X, respectively, said first and said second differential amplifier stage together providing a variable gain at said node A and said node B, based on signals applied to said input X and said input Y, said first and said second differential amplifier stage each further comprising:
a first differential transistor pair comprising a first and a second transistor, said first and said second transistor in communication with a first and a second current source, respectively, said first and said second current source controlled by said first bias current; and
a second differential transistor pair comprising a third and a fourth transistor, said third and said fourth transistor in communication with a third and a fourth current source, respectively, said third and said fourth current source controlled by said second bias current.

20. The CMOS differential amplifier of claim 15, wherein said high frequency variable gain amplifier comprises:
a first and a second differential amplifier, each having an input X and an input Y and output node A and node B, where said input X and said input Y of said first differential amplifier is coupled to an input Vin1 and an input Vin2, respectively, where said input X and said input Y of said second differential amplifier is capacitor-coupled to said node B and said node A of said first differential amplifier, respectively, where said node B and said node A of said second differential amplifier is coupled to an output Out1 and an output Out2, respectively, said first and said second differential amplifier together providing a variable gain at said outputs Out1 and Out2 based on signals applied to said inputs In1 and In2, said first and said second differential amplifier each further comprising:
a first and a second differential amplifier stage coupled together, each having an input G1 and an input G2 and said node A and said node B, said nodes A coupled together and said nodes B coupled together, where said input G1 and said input G2 of said first differential amplifier stage are coupled to said input X and said input Y, respectively, where said input G1 and said input G2 of said second differential amplifier stage is coupled to said input Y and said input X, respectively, said first and said second differential amplifier stage together providing a variable gain at said node A and said node B, based on signals applied to said input X and said input Y, said first and said second differential amplifier stage each further comprising:

a first differential transistor pair comprising a first and a second transistor, the source of said first and said second transistor in communication with a first current mirror, said first current source controlled by said first bias current; and a second differential transistor pair comprising a third and a fourth transistor, the source of said third and said fourth transistor in communication with a second current mirror, said second current mirror controlled by said second bias current.

21. The CMOS differential amplifier of claim 15, wherein said bias control circuit comprises:

a biasing current source controlled by said biasing current, said biasing current source coupled between said voltage supply and said biasing current input, where the gate of said biasing current source is coupled to the gates of a plurality of current mirror pairs and a bias current mirror;

a plurality of bias control differential amplifiers, each comprising a pair of MOS transistors, sources of said pair of MOS transistors coupled via said current mirror pairs, respectively, to a voltage supply, bias control resistive means coupled between the sources of each pair of said MOS transistors such that current from any part of either current mirror pair can flow through either transistor of said MOS transistor pair, the gates of the first MOS transistor of each pair coupled to said intermediate control voltage, the drains of said first MOS transistor of each pair coupled to said first bias current input and to said bias current mirror, the drains of said second MOS transistor of each pair coupled to said second bias current input;

a first operational amplifier having a positive and a negative input, said positive input of said first operational amplifier coupled to said second control voltage, the output and said negative input of said first operational amplifier coupled together to provide feedback; and a plurality of voltage reference resistive means coupled in series between a reference supply and the output of said first operational amplifier, where the number of said voltage reference resistive means is one more than the number of said bias control differential amplifiers, where the junction of the first and the second voltage reference resistive means is coupled to the gate of said second MOS transistor of the first pair of MOS transistors, where the junction of the second and the third voltage reference resistive means is coupled to the gate of said second MOS transistor of the second pair of MOS transistors, and continuing similarly till where the junction of the nth and the nth-plus-one voltage reference resistive means is coupled to the gate of said second MOS transistor of the nth pair of MOS transistors, said junctions of said voltage reference resistive means providing reference voltages to their respective transistor gates.

22. The bias control circuit of claim 21, wherein the relationship between said first and said second bias current is expressed by the equations:

$$I_{B1}=mI_B$$

and $$I_{B2}=(1-m)I_B$$

where:

$$m=f(V_{CT})$$

where:

$I_{B1}$ is said first bias current, $I_{B2}$ is said second bias current, $V_{CT}$ is said intermediate control voltage.

23. The bias control circuit of claim 21, wherein the size of the transistors of each of said current mirror pairs are chosen such that said first and said second bias current always equals said biasing current.

24. The bias control circuit of claim 21, wherein the size of the transistors of each of said current mirror pairs, the magnitude of said reference voltages, and said bias control resistive means are chosen such that said first and said second bias current can vary the gain of said high frequency variable gain amplifier in linear-in-dB fashion.

25. The CMOS differential amplifier of claim 15, wherein said temperature sensing circuit comprises:

a band-gap reference-cum-PTAT current generator for generating a temperature independent band-gap voltage node of about 1.2 volt, and for providing said PTAT dependent current which increases linearly with temperature;

a temperature-to-current converter (TTC) for converting said band-gap voltage into a nearly temperature independent prime current reference $I_{REF}$, and for splitting said prime current reference $I_{REF}$ into said first and said second reference current, said TTC further comprising:

a third operational amplifier having a negative and a positive input, and an output, the positive input of said third operational amplifier coupled to said 1.2 volt bandgap voltage node; and a first and a second voltage-to-current converter (VTCC) MOS transistor, the gates of said first and said second VTCC MOS transistor coupled to the output of said third operational amplifier, the source said first and said second VTCC coupled to the negative input of said third operational amplifier to provide feedback, the source said first and said second VTCC additionally in communication with a reference potential via a prime reference resistive means, where the drain of said first VTCC MOS transistor provides said prime current reference $I_{REF}$, and where the drain of said second VTCC MOS transistor is the current source for said second bias current.

26. The CMOS differential amplifier of claim 15, wherein said gain compensation circuit comprises:

a gain compensation differential amplifier comprising a differentially arranged MOS transistor pair, each MOS transistor of said MOS transistor pair coupled via a load resistive means to said biasing current input, the sources of said MOS transistor pair joined together into a junction;

a gain compensation current source coupled with its drain and gate to said second reference current for driving a first, a second, and a third gain compensation current mirror;

a gate resistive means serially coupled to a gain compensation resistive means, thus forming a voltage divider, where said gate resistive means is coupled to a voltage supply, and where said gain compensation resistive means is coupled to said first gain compensation current mirror, the voltage drop across said gain compensation resistive means providing the input voltage to the gates of said MOS transistor pair;

a fourth operational amplifier having a positive and a negative input, where one input is coupled to one drain and the other input is coupled to the other drain of said MOS transistor pair;

a control PMOS transistor coupled between said voltage supply and said junction of said MOS transistor pair, where the gate of said control PMOS transistor is coupled to the output of said fourth operational amplifier;

said second gain compensation current mirror coupled to said junction of said MOS transistor pair, where the tail current, equal to said biasing current, flowing out of the sources of said MOS transistor pair is diminished by the compensation current flowing out of the drain of said PMOS transistor, thus controlling said biasing current as a function of process variations; and said third gain compensation current mirror coupled to said negative input of said fourth operational amplifier.

27. A high frequency CMOS differential amplifier, comprising:

a high frequency variable gain amplifier for providing a differential variable gain amplification of a first and a second input signal, where the gain of said high frequency variable gain amplifier depends on a first and a second bias current applied to said high frequency variable gain amplifier, said high frequency variable gain amplifier comprising at least two differential amplifiers, where the gain of said high frequency variable gain amplifier is independent of temperature and process;

a bias control circuit for receiving an intermediate control voltage, a second control voltage, and a biasing current and producing said first and said second bias current by comparing said intermediate control voltage against reference voltages, where said reference voltages are generated by said bias control circuit from said second control voltage and a first operational amplifier;

a gain-slope correction circuit for receiving a first control voltage, said second control voltage, a temperature independent first reference current, and a proportional to absolute temperature (PTAT) dependent current and producing said intermediate control voltage as a function of temperature by comparing said temperature independent first reference current and said PTAT dependent current, thereby compensating for a change in slope of the gain control characteristics with temperature of said high frequency variable gain amplifier, said gain-slope correction circuit further comprising:

a gain-slope correction comparator used to comparing said temperature independent first reference current with said PTAT dependent current and digitizing the comparison, said gain-slope correction comparator further comprising:

a series of current comparators formed with p-channel cascoded and n-channel cascoded transistors serially coupled, where the gates of said p-channel cascoded transistors are driven by a voltage drop generated by said first reference current across a first gain-slope correction resistive means, and where the gates of said n-channel cascoded transistors are driven by a voltage drop generated by said PTAT current across a second gain-slope correction resistive means, a junction of said p-channel cascoded and n-channel cascoded transistor going more positive when said p-channel cascoded transistor carries a higher current than its serially coupled n-channel cascoded transistor;

a decoder coupled to the junctions of said p-channel cascoded and n-channel cascoded transistors for receiving digitized signals from said junctions thus providing digital logic signal outputs ranging from all "zeros" to all "ones";

a feedback ratio circuit for altering the feedback ratio and thus the amplification-attenuation of a second operational amplifier with temperature, said feedback ratio circuit further comprising:

a series of control switches, equal in number to the number of outputs from said decoder, activated by said logic signal outputs, where one terminal of all of said control switches is ganged together into one line;

said second operational amplifier for receiving at its negative input said ganged together line, and for receiving at its positive input said second control voltage;

a serially coupled string of temperature control resistive means, numbering one more than the number of logic signal outputs of said decoder, coupled between said first control voltage and the output of said second operational amplifier, where the other terminal of said first control switch is coupled between the first and the second temperature control resistive means, where the other terminal of said second control switch is coupled between the second and the third temperature control resistive means, and so on, till the other terminal of said last control switch is coupled between the next-to-last and last temperature control resistive means;

a temperature sensing circuit for providing said band-gap reference voltage plus proportional to absolute temperature (PTAT) dependent current generator, and a temperature independent first and second reference current, said temperature sensing circuit further comprising:

a band-gap reference-cum-PTAT current generator for generating a temperature independent band-gap voltage node of about 1.2 volt, and for providing said PTAT dependent current which increases linearly with temperature;

a temperature-to-current converter (TTC) for converting said band-gap voltage into a nearly temperature independent prime current reference $I_{REF}$, and for splitting said prime current reference $I_{REF}$ into said first and said second reference current, said TTC further comprising:

a third operational amplifier having a negative and a positive input, and an output, the positive input of said third operational amplifier coupled to said 1.2 volt bandgap voltage node;

a first and a second voltage-to-current converter (VTCC) MOS transistor, the gates of said first and said second VTCC MOS transistor coupled to the output of said third operational amplifier, the source said first and said second VTCC coupled to the negative input of said third operational amplifier to provide feedback, the source said first and said second VTCC additionally in communication with a reference potential via a prime reference resistive means, where the drain of said first VTCC MOS transistor provides said prime current reference $I_{REF}$, and where the drain of said second VTCC MOS transistor is the current source for said second bias current; and a gain compensation circuit for receiving said temperature independent second reference current, and said biasing current which is modified by said temperature independent second reference current.

28. The gain-slope correction circuit of claim 27, wherein said n-channel cascoded transistors have identical sizes.

29. The gain-slope correction circuit of claim 27, wherein said p-channel cascoded transistors have progressively increasing sizes.

30. The gain-slope correction circuit of claim 27, wherein the junctions of said n-channel cascode and p-channel cascode transistors go one-by-one progressively low in voltage as the temperature of the functional circuits increases.

31. The CMOS differential amplifier of claim 27, wherein said high frequency variable gain amplifier comprises:

a first and a second differential amplifier, each having an input X and an input Y and output node A and node B, where said input X and said input Y of said first differential amplifier is coupled to an input Vin1 and an input Vin2, respectively, where said input X and said input Y of said second differential amplifier is direct-coupled to said node B and said node A of said first differential amplifier, respectively, where said node B and said node A of said second differential amplifier is coupled to an output Vout1 and an output Vout2, respectively, said first and said second differential amplifier together providing a variable gain at said outputs Vout1 and Vout2 based on signals applied to said inputs Vin1 and Vin2, said first and said second differential amplifier each further comprising:

a first and a second differential amplifier stage coupled together, each having an input G1 and an input G2 and said node A and said node B, said nodes A coupled together and said nodes B coupled together, where said input G1 and said input G2 of said first differential amplifier stage are coupled to said input X and said input Y, respectively, where said input G1 and said input G2 of said second differential amplifier stage is coupled to said input Y and said input X, respectively, said first and said second differential amplifier stage together providing a variable gain at said node A and said node B, based on signals applied to said input X and said input Y, said first and said second differential amplifier stage each further comprising:

a first differential transistor pair comprising a first and a second transistor, said first and said second transistor in communication with a first and a second current source, respectively, said first and said second current source controlled by said first bias current; and a second differential transistor pair comprising a third and a fourth transistor, said third and said fourth transistor in communication with a third and a fourth current source, respectively, said third and said fourth current source controlled by said second bias current.

32. The CMOS differential amplifier of claim 27, wherein said high frequency variable gain amplifier comprises:

a first and a second differential amplifier, each having an input X and an input Y and output node A and node B, where said input X and said input Y of said first differential amplifier is coupled to an input Vin1 and an input Vin2, respectively, where said input X and said input Y of said second differential amplifier is capacitor-coupled to said node B and said node A of said first differential amplifier, respectively, where said node B and said node A of said second differential amplifier is coupled to an output Out1 and an output Out2, respectively, said first and said second differential amplifier together providing a variable gain at said outputs Out1 and Out2 based on signals applied to said inputs In1 and In2, said first and said second differential amplifier each further comprising:

a first and a second differential amplifier stage coupled together, each having an input G1 and an input G2 and said node A and said node B, said nodes A coupled together and said nodes B coupled together, where said input G1 and said input G2 of said first differential amplifier stage are coupled to said input X and said input Y, respectively, where said input G1 and said input G2 of said second differential amplifier stage is coupled to said input Y and said input X, respectively, said first and said second differential amplifier stage together providing a variable gain at said node A and said node B, based on signals applied to said input X and said input Y, said first and said second differential amplifier stage each further comprising:

a first differential transistor pair comprising a first and a second transistor, the source of said first and said second transistor in communication with a first current mirror, said first current source controlled by said first bias current; and a second differential transistor pair comprising a third and a fourth transistor, the source of said third and said fourth transistor in communication with a second current mirror, said second current mirror controlled by said second bias current.

33. The CMOS differential amplifier of claim 27, wherein said bias control circuit comprises:

a biasing current source controlled by said biasing current, said biasing current source coupled between said voltage supply and said biasing current input, where the gate of said biasing current source is coupled to the gates of a plurality of current mirror pairs and a bias current mirror;

a plurality of bias control differential amplifiers, each comprising a pair of MOS transistors, sources of said pair of MOS transistors coupled via said current mirror pairs, respectively, to a voltage supply, bias control resistive means coupled between the sources of each pair of said MOS transistors such that current from any part of either current mirror pair can flow through either transistor of said MOS transistor pair, the gates of the first MOS transistor of each pair coupled to said intermediate control voltage, the drains of said first MOS transistor of each pair coupled to said first bias current input and to said bias current mirror, the drains of said second MOS transistor of each pair coupled to said second bias current input;

a first operational amplifier having a positive and a negative input, said positive input of said first operational amplifier coupled to said second control voltage, the output and said negative input of said first operational amplifier coupled together to provide feedback; and a plurality of voltage reference resistive means coupled in series between a reference supply and the output of said first operational amplifier, where the number of said voltage reference resistive means is one more than the number of said bias control differential amplifiers, where the junction of the first and the second voltage reference resistive means is coupled to the gate of said second MOS transistor of the first pair of MOS transistors, where the junction of the second and the third voltage reference resistive means is coupled to the gate of said second MOS transistor of the second pair of MOS transistors, and continuing similarly till where the junction of the nth and the nth-plus-one voltage reference resistive means is coupled to the gate of said second MOS transistor of the nth pair of MOS transistors, said junctions of said voltage reference resistive means providing reference voltages to their respective transistor gates.

34. The bias control circuit of claim 33, wherein the relationship between said first and said second bias current is expressed by the equations:

$$I_{B1} = mI_B$$

and $$I_{B2} = (1-m)I_B$$

where:

$$m = f(V_{CT})$$

where:

$I_{B1}$ is said first bias current, $I_{B2}$ is said second bias current, $V_{CT}$ is said intermediate control voltage.

35. The bias control circuit of claim 33, wherein the size of the transistors of each of said current mirror pairs are chosen such that said first and said second bias current always equals said biasing current.

36. The bias control circuit of claim 33, wherein the size of the transistors of each of said current mirror pairs, the magnitude of said reference voltages, and said bias control resistive means are chosen such that said first and said second bias current can vary the gain of said high frequency variable gain amplifier in linear-in-dB fashion.

37. The CMOS differential amplifier of claim 27, wherein said gain compensation circuit comprises:

a gain compensation differential amplifier comprising a differentially arranged MOS transistor pair, each MOS transistor of said MOS transistor pair coupled via a load resistive means to said biasing current input, the sources of said MOS transistor pair joined together into a junction;

a gain compensation current source coupled with its drain and gate to said second reference current for driving a first, a second, and a third gain compensation current mirror;

a gate resistive means serially coupled to a gain compensation resistive means, thus forming a voltage divider, where said gate resistive means is coupled to a voltage supply, and where said gain compensation resistive means is coupled to said first gain compensation current mirror, the voltage drop across said gain compensation resistive means providing the input voltage to the gates of said MOS transistor pair;

a fourth operational amplifier having a positive and a negative input, where one input is coupled to one drain and the other input is coupled to the other drain of said MOS transistor pair;

a control PMOS transistor coupled between said voltage supply and said junction of said MOS transistor pair, where the gate of said control PMOS transistor is coupled to the output of said fourth operational amplifier;

said second gain compensation current mirror coupled to said junction of said MOS transistor pair, where the tail current, equal to said biasing current, flowing out of the sources of said MOS transistor pair is diminished by the compensation current flowing out of the drain of said PMOS transistor, thus controlling said biasing current as a function of process variations; and said third gain compensation current mirror coupled to said negative input of said fourth operational amplifier.

* * * * *